US00RE39814E

(19) United States
(12) Reissued Patent
Lindholm et al.

(10) Patent Number: US RE39,814 E
(45) Date of Reissued Patent: Sep. 4, 2007

(54) CEMENTED CARBIDE INSERT AND METHOD OF MAKING SAME

(75) Inventors: Mikael Lindholm, Hägersten (SE); Anders Lenander, Tyresö (SE); Per Lindskog, Älvsjö (SE)

(73) Assignee: Sandvik Intellectual Property AB, Sandviken (SE)

(21) Appl. No.: 11/449,013

(22) Filed: Jun. 8, 2006

Related U.S. Patent Documents

Reissue of:
(64) Patent No.: 6,326,093
Issued: Dec. 4, 2001
Appl. No.: 09/655,887
Filed: Sep. 6, 2000

(30) Foreign Application Priority Data

Sep. 6, 1999 (SE) ..... 9903122

(51) Int. Cl.
*B32B 15/00* (2006.01)

(52) U.S. Cl. ..... 428/699; 51/307; 427/249.19; 428/615; 428/548; 428/627; 428/636; 428/457; 428/689; 428/697; 428/698; 428/704

(58) Field of Classification Search ..... 51/307; 427/249.19; 428/699, 615, 548, 627, 636, 428/457, 689, 697, 698, 704
See application file for complete search history.

(56) References Cited

U.S. PATENT DOCUMENTS 5,266,388 A 11/1993 Santhanam et al.
5,700,551 A 12/1997 Kukino et al.
5,879,823 A 3/1999 Prizzi et al.
6,200,671 B1 3/2001 Lindskog et al.
6,250,855 B1 6/2001 Persson et al.

FOREIGN PATENT DOCUMENTS

EP 701 982 * 3/1996
EP 0 701 982 B1 3/1996
JP 11-222665 8/1999
SE 511 089 8/1999

OTHER PUBLICATIONS

Derwent's Abstract No. 1999–520900, Week 199944, Abstract of Japan 11222665, Aug. 17, 1999.
U.S. Appl. No. 09/077,424, Lindskog et al., filed Sep. 1998.*
U.S. Appl. No. 09/534,006, Persson et al., filed Mar. 2000.*

* cited by examiner

*Primary Examiner*—Archene Turner
(74) *Attorney, Agent, or Firm*—Drinker Biddle & Reath LLP

(57) ABSTRACT

The present invention relates to a coated cemented carbide cutting tool particularly for turning applications with high toughness demands, of stainless steels of different compositions and microstructures, and of low and medium alloyed non-stainless steels. The cemented carbide is WC-Co based with a composition of 9–12 wt % Co, 0.2–2.0 wt % cubic carbides from elements from group IVa, Va or VIa of the periodic table and balance WC with a grain size of 1.5–2 μm. The binder phase is W-alloyed with a CW-ratio in the range of 0.77–0.95. The coating includes a multilayered structure of the composition $(Ti_xAl_{1-x},)N$ in which x varies repeatedly between the two ranges $0.45<x<0.55$ and $0.70<x<0.80$, adding up to a total thickness of 2–9 μm.

20 Claims, No Drawings

CEMENTED CARBIDE INSERT AND METHOD OF MAKING SAME

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 6,326,093 B1, which claims the benefit of priority to Swedish Application No. 9903122-1 filed Sep. 6, 1999.*

BACKGROUND OF THE INVENTION

1. Field of the Invention

The present invention relates to a coated cemented carbide cutting tool, such as a cutting tool insert for the turning of stainless steels, particularly in applications with high demands on the toughness properties of the insert. Additionally, the insert is provided not only for the turning of stainless steels with different compositions and microstructures, such as austenitic, ferritic, ferriteaustenitic, superaustenitic and precipitation hardened stainless steels, but also for the turning of non-stainless steels, such as low carbon steels and low and medium alloyed steels.

2. State of the Art

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

It is well known that for cemented carbide cutting tools used in the machining of steels, the cutting edge is worn by different wear mechanisms. Examples of such mechanisms include chemical and abrasive wear. Additionally, external variables, such as cutting speed, depth of cut, and cutting feed rate, and external cutting operations, such as the use of coolant, and off-centered work piece, and a cast skin on a work piece, require a number of different properties of the cutting edge. As an examples, the tool edge may fracture under a heavy intermittent cutting load resulting in so-called edge chipping. The chipping is due to a lack of edge toughness. Furthermore, when turning stainless steel, still another wear mechanism is active called adhesive wear. This type of wear is caused by the adhesive force between the stainless steel chip of the workpiece and the cutting edge. When the adhesive force grows large enough, edge chipping on the cutting edge will occur and, hence, the tool life will be shortened. Also, when utilizing a cemented carbide cutting tool for the turning of a stainless steel part when increasing the cutting speed in a stainless steel grade, the thermal energy developed in the cutting edge is considerable and the entire tool edge may plastically deform. This type of wear mechanism is known as plastic deformation wear and is in clear conflict with the edge toughness required to prevent or minimize edge chipping. Hence, another requirement of the coated cemented carbide insert is that the selection of the carbide composition and the coating material results in a cutting edge exhibiting a high resistance to plastic deformation.

Commercial cemented carbide tools suitable for the machining of stainless steels, such as those described in SE 9602413-8 and SE 9901149-6, are usually optimized with respect to some of the required tool properties mentioned above, i.e. high resistance to mechanical, chemical, abrasive, adhesive, thermal and plastic deformation wear.

SUMMARY OF THE INVENTION

Excellent cutting performance in the turning of stainless steels with concomitant high toughness demands and high resistance to plastic deformation, as is especially encountered in heavy intermittent cutting conditions, can be obtained by a combination of a coated cemented carbide body comprising a WC based substrate with small additions of cubic carbides, W alloyed Co binder and with a specific grain size range of the WC grains, a specific composition range of WC+Co and a coating including an innermost, very thin layer of TiN, a second layer of TiAlN with a periodic variation of the Ti/A1 ratio along the normal to the substrate/coating interface, and an outermost layer of TiN.

A coated cemented carbide cutting tool and a method of making the same is provided. The cutting tool is comprised of a WC-Co based cemented carbide body and a hard and wear resistant coating. The cemented carbide body is comprised of a composition of 9–12 wt % Co, 0.2–2.0 wt % cubic carbides from elements from group IVa, Va or VIa of the periodic table, preferably 1.2–1.8 wt % cubic carbides of the metals Ta, Nb and Ti, and the balance WC with an average grain size of the WC of 1.5–2 μm and a W-alloyed binder phase with a CW-ratio in the range of 0.77–0.95. Deposited on the WC-Co cemented carbide body is a refractory multilayered coating. The first innermost layer is 0.1–0.5 μm of TiN. A second layer is comprised of a multilayered structure of 8–30 sublayers each with a thickness of 0.05–0.2 μm and of the composition $(Ti_xAl_{1-x})N$ in which x varies alternately and repeatedly between the two ranges $0.45<x<0.55$ and $0.70<x<0.80$, respectively. After the multilayered structure, a third layer of $(Ti_xAl_{1-x})N$, where x is found in the range $0.45<x<0.5$, is deposited to a thickness of at least 0.2 μm. A fourth and outermost layer of TiN is deposited to a thickness of 0.1–0.2 μm. The total coating thickness is in the range of 2–9 μm and the thickness of the second layer constitutes 75–95 % of the total coating thickness.

DETAILED DESCRIPTION OF THE INVENTION

According to the present invention, a turning tool insert particularly useful for difficult stainless steel turning is provided with a cemented carbide substrate with a composition of 9–12 wt % Co, preferably 10–11 wt % Co, 0.2–2.0 wt % cubic carbides, preferably 1. 2–1.8 wt % cubic carbides of the metals Ta, Nb and Ti and balance WC. The cemented carbide may also contain other carbides from elements from group IVa, Va or VIa of the periodic table. The content of Ta is preferably over 0.8 wt %. The preferred average grain size of the WC at the preferred composition of 10–11 wt-% Co is 1.5–2 μm, most preferably between 1.6 and 1.8 μm. The centered carbide may contain small amounts, <1 volume %, of η-phase ($M_6C$), without any detrimental effect.

The cobalt binder phase is alloyed with W. The content of W in the binder phase can be expressed as the CW-ratio:

$$\text{CW-ratio}=M_s/(\text{wt \% Co}^{*}0.0161)$$

where $M_s$ is the measured saturation magnetisation of the cemented carbide substrate in [kA/m] $hAm^2/kg$ and wt % Co is the weight percentage of Co in the cemented carbide. The CW-value is a function of the W content in the Co binder phase. A high CW-value corresponds to a low W-content in the binder phase. According to the present invention, improved cutting performance is achieved if the cemented carbide substrate has a CW-ratio of 0.77–0.95, preferably 0.82–0.921. From the CW-value it follows that no free graphite is allowed.

The hard and wear resistant refractory coating deposited on the above described cemented carbide substrate according to the present invention comprises a first (innermost) thin 0.1–0.5 μm bonding layer of TiN, a second layer comprising a multilayered structure of sublayers of the composition $(Ti_xAl_{1-x})N$ in which x varies repeatedly between the two ranges $0.45<x<0.55$ and $0.70<x<0.80$, a third thin, at least 0.2 μm, preferably 0.4–0.8 μm, layer of $(Ti_xAl_{1-x})N$ having an x-value in the range $0.45<x<0.55$ and a fourth outermost thin 0.1–0.2 μm layer of TiN.

The first sublayer of $(Ti_xAl_{1-x})N$ adjacent to the TiN bonding layer has an x-value in the range $0.45<x<0.55$, the second sublayer of $(Ti_xAl_{1-x})N$ has an x-value in the range $0.70<x<0.80$ and the third sublayer has x in the range $0.45<x<0.55$ and so forth repeated until 8–30 sublayers, preferably 22–24 sublayers, are formed. The thickness of this second layer comprising a multilayered structure of sublayers constitutes 75–95% of the total coating thickness. The individual sublayers of $(Ti_xAl_{1-x})N$ are essentially of the same thickness but their thickness may also vary in a regular or irregular way and said sublayer thickness is found in the range of 0.05–0.2 μm.

The total thickness of the coating deposited on the cemented carbide substrate according to the present invention may vary in the range of 2–9 μm, preferably 3.5–7 μm. The layer thickness, the sublayer thickness and the coating thickness quoted above refers to measurements made close to the cutting edge, i.e. the functional part of the cutting tool.

EXAMPLE 1

A. A cemented carbide turning insert according to the invention with the composition 10.5 wt % Co, 1.16 wt % Ta, 0.28 wt % Nb and balance made up by WC and with an average WC grain size of 1.7 μm, with a binder phase alloyed with W corresponding to a CW-ratio of 0.90, were coated with a total coating thickness of 4.5 μm by applying conventional PVD cathodic arc technique. The coating comprised a first (innermost) 0.2 μm layer of TiN followed by a 3.7 μm thick second layer comprising 23 alternating sublayers of $(Ti_xAl_{1-x})N$, where x alternatively varied between 0.5 and 0.75, and a third 0.4 μm $(Ti_xAl_{1-x})N$ layer, where x=0.5, and, finally, an outermost 0.2 μm layer of TiN.

B. A commercial cemented carbide turning insert with the composition 8.0 wt % Co, and balance made up by WC with an average WC grain size of 3.0 μm, with a binder phase low alloyed with W corresponding to a CW-ratio of 0.94, were coated with a 2.8 μm thick conventional multilayered CVD-coating according to the sequence TiN/TiCN/TiCN/TiN. The sublayers have approximately the same thickness.

| | |
|---|---|
| Operation: | Alternating axial and facial turning of an 80 mm diameter bar |
| Work-piece material: | Austenitic stainless steel (AISI316L) |
| Cutting speed: | 160 m/min |
| Feed rate: | 0.4 mm/rev |
| Depth of cut: | 2 mm |
| Insert-style: | CNMG120408-MM |

| Results: | Tool life (cycles): |
|---|---|
| Inserts A: | 5 |
| Inserts B: | 2 |

Comment. The main wear mechanism was plastic deformation of the cutting edge line resulting in a flank wear. Tool life criterion was flank wear>0.3 mm.

EXAMPLE 2

Inserts as in A and B from Example 1 were tested in a turning operation.

| | |
|---|---|
| Operation: | Facing of a 130 mm bar with two flat sides |
| Work-piece material: | Austenitic stainless steel (SS2343) |
| Cutting speed: | 190 m/min |
| Feed rate: | 0.3 mm |
| Depth of cut: | 2 mm |
| Insert-style: | CNMG120408-MM |

| Results: | Tool-life (cycles) |
|---|---|
| Inserts A: | 14 |
| Inserts B: | 6 |

Comment: The performance criterion was bad cutting action. The insert B shows more chipping along the cutting edge caused by more adhesion to the chips during the operation.

EXAMPLE 3

Inserts as in A and B from Example 1 were tested in a turning operation.

| | |
|---|---|
| Operation: | External turning of a ring with 18 mm thickness |
| Work-piece material: | Austenitic stainless steel (AISI316L) |
| Cutting speed: | 140 m/min |
| Feed rate: | 0.35 mm |
| Depth of cut: | 4 mm |
| Insert-style: | CNMG190616-MR |

| Results: | Tool-life (cycles) |
|---|---|
| Inserts A: | 40 |
| Inserts B: | 29 |

Comment: The tool-life criterion was spalling on the work piece caused by edge chipping due to lack of edge toughness.

EXAMPLE 4

Inserts as in A and B from Example 1 were tested in a turning operation.

| | |
|---|---|
| Operation: | Longitudinal turning with interrupted cuts |
| Work-piece material: | Steel (SS1312) |
| Cutting speed: | 80 m/min |
| Feed rate: | 0.4 mm |
| Depth of cut: | 2 mm |
| Insert style: | CNMG120408-MM |

| Results: | Tool-life (minutes) |
|---|---|
| Inserts A: | 10 |
| Inserts B: | 5 |

Comment: The tool-life criterion was edge breakage. Insert A ran a full cycle. Since the difference is very big you can consider insert A to have a better toughness behaviour.

EXAMPLE 5

Inserts as in A and B from Example 1 were tested in a turning operation.

| | |
|---|---|
| Operation: | Alternating facing and turning of a bar 70 mm in diameter |
| Work-piece material: | Ferriteaustenitic steel (SAF2205) |
| Cutting speed: | 100 m/min |
| Feed rate: | 0.3 mm |
| Depth of cut: | 2 mm |
| Insert-style: | CNMG120408-MM |

| Results: | Tool-life (cycles) |
|---|---|
| Inserts A: | 11 |
| Inserts B: | 4 |

Comment: The tool-life criterion was bad cutting action due to edge frittering, which is due to lack of edge toughness.

EXAMPLE 6

Inserts as in A and B from Example 1 were tested in a turning operation.

| | |
|---|---|
| Operation: | External turning of a bar 120 mm in diameter |
| Work-piece material: | Steel (SS2541) |
| Cutting speed: | 110 m/min |
| Feed rate: | 0.6 mm |
| Depth of cut: | 2 mm |
| Insert-style: | CNMG120408-MM |

| Results: | Edge depression (mm) |
|---|---|
| Inserts A: | 0.035 |
| Inserts B: | 0.085 |

Comment: Tool-life criterion was predetermined time in cut (0.5 min). The depression in the cutting edge was caused by lack of resistance to plastic deformation.

The present invention also relates to a method of making the above mentioned coated cutting tool insert comprising a WC-Co based cemented carbide body including an amount lower than 2.0 wt % of cubic carbides and with a composition of WC/Co in the range of 9–12 wt % Co, preferably 10–11 wt % Co and most preferably 10.2–10.8 wt % Co, and an amount of cubic carbides in the range of 0.2–2.0 wt %, and the balance is made up by WC. The average WC grain size is found in the range of 1.5–2.0 μm, preferably 1.6–1.8 μm.

The hard and wear resistant refractory coating is deposited onto the cemented carbide substrate by conventional PVD (Physical Vapor Deposition) methods. According to the present invention, a first (innermost) thin 0.1–0.5 μm bonding layer of TiN is deposited, a second layer comprising a multilayered structure of sublayers of the composition $(Ti_xAl_{1-x})N$ in which x varies repeatedly between the two ranges $0.45<x<0.55$ and $0.70<x<0.80$is then deposited, a third thin, at least 0.2 μm, preferably 0.4–0.8 μm, layer of $(Ti_xAl_{1-x})N$ having an x-value in the range $0.45<x<0.55$ is deposited, and a fourth (outermost) thin 0.1–0.2 μm layer of TiN is finally deposited. Additionally, the first sublayer of $(Ti_xAl_{1-x})N$ adjacent to the TiN bonding layer has an x-value in the range $0.45<x<0.55$, the second sublayer of $(Ti_xAl_{1-x})N$ has an x-value in the range $0.70<x<0.80$ and the third sublayer has x in the range $0.45<x<0.55$ and so forth repeated until 8–30 sublayers, preferably 22–24 sublayers, are formed. The thickness of this second layer comprising a multilayered structure of sublayers constitutes 75–95% of the total coating thickness. The individual sublayers of $(Ti_xAl_{1-x})N$ are essentially of the same thickness but their thickness may also vary in a regular or irregular way and said sublayer thickness is found in the range of 0.05–0.2 μm.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A coated cemented carbide cutting tool comprising:

a WC—Co based cemented carbide body comprising a composition of 9–12 wt % Co, 0.2–2.0 wt % cubic carbides from elements from group IVa, Va or VIa of the periodic table and balance WC with an average grain size of the WC of 1.5–2 μm and a W-alloyed binder phase with a CW-ratio in the range of 0.77–0.95; and a hard and wear resistant coating deposited on the WC—Co cemented carbide body comprising:

a first innermost bonding layer of TiN;

a second layer comprising a multilayered structure of 0.05–0.2 μm thick sublayers of the composition $(Ti_xAl_{1-x})N$ in which x varies repeatedly between the two ranges $0.45<x<0.55$ and $0.70<x<0.80$, the first sublayer of $(Ti_xAl_{1-x})N$ adjacent to the TiN bonding layer having an x-value in the range $0.45<x<0.55$, the second sublayer of $(Ti_xAl_{1-x})N$ having an x-value in the range $0.70<x<0.80$ and the third sublayer having an x value in the range $0.45<x<0.55$ and so forth repeated until 8–30 sublayers are built up;

a third at least 0.2 μm thick layer of $(Ti_xAl_{1-x})N$, where x is in the range $0.45<x<0.55$;

a fourth outermost layer of TiN;

wherein the total coating thickness is in the range of 2–9 μm and the thickness of the second layer constitutes 75–95% of the total coating thickness.

2. The cutting tool according to claim 1, wherein the Co content is 10–11 wt %.

3. The cutting tool according to claim 1, wherein the 0.2–2.0 wt % cubic carbides from elements from group IVa, Va or VIa of the periodic table are 1.2–1.8 wt % cubic carbides of the metals Ta, Nb and Ti.

4. The cutting tool according to claim 1, wherein the content of Ta is preferably over 0.8 wt %.

5. The cutting tool according to claim 1, wherein the CW-ratio shall preferably over 0.82–0.92.

6. The cutting tool according to claim 1, wherein the coating comprises a first innermost 0.1–0.5 μm layer of TiN, a second layer having a multilayered structure of 22–24 sublayers of the composition $(Ti_xAl_{1-x})N$ in which x varies repeatedly between the two ranges $0.45<x<0.55$ and $0.70<x<0.80$, a third 0.4–0.8 μm layer of $(Ti_xAl_{1-x})N$ having an x-value in the range $0.45<x<0.55$, and a fourth outermost thin 0.1–0.2 μm layer of TiN.

7. The cutting tool according to claim 1, wherein the coating has a total thickness of 3.5–7 μm.

8. The cutting tool according to claim 1, wherein the average WC grain size is between 1.6 and 1.8 μm.

9. A method of making a cutting tool, the method comprising:

forming a powder mixture containing WC, Co and cubic carbides;

mixing said powders with pressing agent and W metal such that the desired CW-ratio is obtained;

milling and spray drying the mixture to a powder material with the desired properties;

pressing and sintering the powder material at a temperature of 1300–1500° C., in a controlled atmosphere of about 50-mbar followed by cooling to form a substrate; and applying a hard, wear resistant coating by PVD techniques comprising:

depositing a first innermost bonding layer of TiN;

depositing a second layer comprising a 0.05–0.2 μm thick multilayered structure of sublayers of the composition $(Ti_xAl_{1-x})N$ in which x varies repeatedly between the two ranges $0.45<x<0.55$ and $0.70<x<0.80$, the first sublayer of $(Ti_xAl_{1-x})N$ adjacent to the TiN bonding layer having an x-value in the range $0.45<x<0.55$, the second sublayer of $(Ti_xAl_{1-x})N$ having an x-value in the range $0.70<x<0.80$ and the third sublayer having an x value in the range $0.45<x<0.55$, and so forth repeated until 8–30 sublayers are built up;

depositing a third at least 0.2 μm thick layer of $(Ti_xAl_{1-x})N$, where x is in the range $0.45<x<0.55$;

depositing a fourth outermost layer of TiN;

wherein the total coating thickness is in the range of 2–9 μm and the thickness of the second layer constitutes 75–95 % of the tool coating thickness.

10. The cutting tool of claim 1, wherein the third layer has a thickness which exceeds the thickness of any of the individual sublayers.

11. The cutting tool of claim 1, wherein the third layer has a thickness of 0.4–0.8 μm.

*12. The method of claim 9, wherein the third layer has a thickness of 0.4-0.8 μm.*

*13. The method of claim 9, wherein the desired CW-ratio is 0.77-0.95.*

*14. The method of claim 13, wherein the desired CW-ratio is 0.82-0.92.*

*15. The method of claim 9, wherein the first innermost bonding layer of TiN has a thickness of 0.1-0.5 μm, the multilayered structure of the second layer has 8-30 sublayers, the third layer has a thickness of 0.4-0.8 μm, and the fourth outermost layer has a thickness of 0.1-0.2 μm.*

*16. The cutting tool according to claim 6, wherein the Co content is 10-11 wt %.*

*17. The cutting tool according to claim 6, wherein the 0.2-2.0 wt % cubic carbides from elements from group IVa, Va or VIa of the periodic table are 1.2-1.8 wt % cubic carbides of the metals Ta, Nb and Ti.*

*18. The cutting tool according to claim 6, wherein the content of Ta is preferably over 0.8 wt %.*

*19. The cutting tool according to claim 6, wherein the CW-ratio is 0.82-0.92.*

*20. The cutting tool according to claim 6, wherein the average WC grain size is between 1.6 and 1.8 μm.*

* * * * *